(12) United States Patent
Fish et al.

(10) Patent No.: US 12,712,151 B2
(45) **Date of Patent: *Aug. 18, 2026**

(54) RADIATION HEATING TO DRY MOISTURE FROM AIR BEARING SHAFT

(71) Applicant: Applied Materials, Inc., Santa Clara, CA (US)

(72) Inventors: Roger B. Fish, Bedford, MA (US); Jeffrey E. Krampert, Topsfield, MA (US)

(73) Assignee: Applied Materials, Inc., Santa Clara, CA (US)

( * ) Notice: Subject to any disclaimer, the term of this patent is extended or adjusted under 35 U.S.C. 154(b) by 354 days.

This patent is subject to a terminal disclaimer.

(21) Appl. No.: 18/541,019

(22) Filed: Dec. 15, 2023

(65) Prior Publication Data

US 2025/0201510 A1 Jun. 19, 2025

(51) Int. Cl.
*H01J 37/317* (2006.01)

(52) U.S. Cl.
CPC ................................ *H01J 37/3171* (2013.01)

(58) Field of Classification Search
CPC .................................................... H01J 37/3171
USPC ..................................................... 250/492.21
See application file for complete search history.

(56) References Cited

U.S. PATENT DOCUMENTS 10,569,299 B2 2/2020 Allen, Jr. et al.
10,971,327 B1 4/2021 Mitchell
10,974,276 B2 4/2021 Allen, Jr. et al.
2008/0280453 A1* 11/2008 Koelmel ............. H10P 72/0436 438/758
2009/0140166 A1 6/2009 Muka
2014/0263268 A1* 9/2014 Cong .................. H05B 1/0227 219/443.1
2015/0024579 A1 1/2015 Graff et al.
2016/0204005 A1* 7/2016 Oki ...................... C23C 16/458 118/725
2020/0139401 A1 5/2020 Allen, Jr. et al.
2023/0011261 A1 1/2023 Li et al.
2023/0095095 A1 3/2023 Natarajan et al.
(Continued)

FOREIGN PATENT DOCUMENTS

CN 106381467 A 2/2017
CN 117467962 A 1/2024
(Continued)

OTHER PUBLICATIONS

International Search Report and Written Opinion mailed May 8, 2025 in co-pending PCT application No. PCT/US2025/011720.
(Continued)

*Primary Examiner* — Kiet T Nguyen
(74) *Attorney, Agent, or Firm* — Nields, Lemack & Frame, LLC

(57) ABSTRACT

A system that reduces the amount of water that enters a process chamber via a movable shaft is disclosed. A ring heater is disposed around the shaft outside the process chamber proximate the air bearing. The ring heater includes a plurality of optical energy emitters arranged around the shaft. The wavelength emitted by the ring heater may be selected to align with the absorption spectrum of water. In this way, the optical energy serves to heat water droplets and lower the tendency for the water droplets to adhere to the movable shaft as it enters the process chamber.

19 Claims, 5 Drawing Sheets

(56) References Cited

U.S. PATENT DOCUMENTS

| | | | |
|---|---|---|---|
| 2025/0201514 | A1 | 6/2025 | Fish et al. |
| 2025/0273425 | A1 | 8/2025 | Fish et al. |

FOREIGN PATENT DOCUMENTS

| | | | |
|---|---|---|---|
| KR | 2016-0033168 | A | 3/2016 |
| TW | 202329198 | A | 7/2023 |

OTHER PUBLICATIONS

Office Action mailed Feb. 4, 2026 in co-pending U.S. Appl. No. 18/541,018.

Notice of Allowance mailed Apr. 17, 2026 in co-pending U.S. Appl. No. 18/587,325.

* cited by examiner

RADIATION HEATING TO DRY MOISTURE FROM AIR BEARING SHAFT

FIELD

Embodiments of the present disclosure relate to systems for removing moisture from shafts used in process chambers, and more particularly, shafts that extend into a process chamber via an air bearing.

BACKGROUND

In certain processing systems, a workpiece is disposed in a process chamber, which is maintained at near vacuum conditions. The workpiece may also be disposed on a movable shaft in the process chamber that allows the workpiece to be moved relative to the incoming ion beam.

In these systems, the movable shaft passes through a wall in the process chamber such that part of the shaft is disposed outside the process chamber, while a second part of the shaft is within the process chamber. An air bearing may be used to provide near frictionless motion between the shaft and the wall. The air bearing also serves to maintain the pressure difference between the process chamber and the outside environment. The shaft is able to be translated so that the portion of the shaft that is disposed within the process chamber can be increased or reduced.

Contaminants, such as water vapor, may collect on the portion of the shaft that is disposed outside the process chamber. As the shaft is translated relative to the wall of the process chamber, these contaminants may enter the process chamber through the air bearing. Once inside the process chamber, these contaminants can affect the yield of the workpieces, or may negatively affect the components within the process chamber.

Therefore, it would be beneficial if there were a system that allowed a shaft to be moved relative to the wall of a process chamber, while reducing or minimizing the amount of contaminants that are introduced into the process chamber as the shaft extends into the chamber.

SUMMARY

A system that reduces the amount of water that enters a process chamber via a movable shaft is disclosed. A ring heater is disposed around the shaft outside the process chamber proximate the air bearing. The ring heater includes a plurality of optical energy emitters arranged around the shaft. The wavelength emitted by the ring heater may be selected to align with the absorption spectrum of water. In this way, the optical energy serves to heat water droplets and lower the tendency for the water droplets to adhere to the movable shaft as it enters the process chamber.

According to one embodiment, a workpiece processing system is disclosed. The workpiece processing system comprises a process chamber, maintained at near vacuum conditions; a shaft extending through a wall of the process chamber, wherein the shaft can be extended into and retracted from the process chamber; and a ring heater disposed around the shaft and outside the process chamber, wherein the ring heater is configured to emit optical energy toward the shaft. In some embodiments, the optical energy has a wavelength in a mid-infrared range. In some embodiments, the optical energy has a wavelength in an ultraviolet range. In some embodiments, a plurality of optical energy emitters are disposed on the ring heater such that the optical energy emitted by the plurality of optical energy emitters is directed toward the shaft. In certain embodiments, the plurality of optical energy emitters comprise laser light emitting diodes (LEDs). In certain embodiments, the ring heater comprises an inner surface directed toward the shaft and the workpiece processing system further comprises a laser source in communication with fiberoptic cables, wherein the fiberoptic cables terminate along the inner surface, and the plurality of optical energy emitters comprise ends of the fiberoptic cables. In certain embodiments, the laser source comprises a fiber laser emitting optical energy at a wavelength between 2.79 μm and 2.94 μm. In certain embodiments, the laser source comprises a $CO_2$ laser emitting optical energy at a wavelength between 9.3 μm and 10.6 μm. In some embodiments, an ion source is in communication with the process chamber. In some embodiments, the system comprises an air bearing through which the shaft extends into the process chamber, wherein the ring heater is disposed proximate to the air bearing.

According to another embodiment, a beam-line ion implantation system is disclosed. The beam-line ion implantation system comprises an ion source to generate an ion beam; a mass analyzer; a process chamber, maintained at near vacuum conditions; one or more beam-line components to direct the ion beam toward a process chamber; a shaft extending through a wall of the process chamber, wherein the shaft can be extended into and retracted from the process chamber; and a ring heater disposed around the shaft and outside the process chamber, wherein the ring heater is configured to emit optical energy toward the shaft. In some embodiments, the system comprises an air bearing through which the shaft extends into the process chamber, wherein the ring heater is disposed proximate to the air bearing. In some embodiments, the optical energy has a wavelength in a mid-infrared range. In some embodiments, the optical energy has a wavelength in an ultraviolet range. In some embodiments, a plurality of optical energy emitters are disposed on the ring heater such that the optical energy emitted by the plurality of optical energy emitters is directed toward the shaft. In certain embodiments, the plurality of optical energy emitters comprise laser light emitting diodes (LEDs). In certain embodiments, the ring heater comprises an inner surface directed toward the shaft and the beam-line ion implantation system further comprises a laser source in communication with fiberoptic cables, wherein the fiberoptic cables terminate along the inner surface, and the plurality of optical energy emitters comprise ends of the fiberoptic cables. In certain embodiments, the laser source comprises a fiber laser emitting optical energy at a wavelength between 2.79 μm and 2.94 μm. In certain embodiments, the laser source comprises a $CO_2$ laser emitting optical energy at a wavelength between 9.3 μm and 10.6 μm.

BRIEF DESCRIPTION OF THE FIGURES

For a better understanding of the present disclosure, reference is made to the accompanying drawings, which are incorporated herein by reference and in which.

DETAILED DESCRIPTION

As described above, in certain systems, a workpiece is moved relative to the ion source via a movable shaft. A portion of this movable shaft may extend outside the process chamber. Additionally, the actuator that controls the movement of the shaft may also be disposed outside the process chamber. The process chamber is typically maintained at near vacuum conditions, which may be less than 50 millitorr. In certain embodiments, the process chamber may be maintained at less than 10 millitorr. The environment outside process chamber is typically at atmospheric pressure. An air bearing may be used to maintain the pressure differential between the outside environment and the process chamber. However, contaminants, such as water vapor, may collect on the portion of the shaft that is outside the process chamber. These contaminants may then enter the process chamber when the shaft is extended into the process chamber. As described above, these contaminants may affect the yield of the workpiece or affect the components within the process chamber.

Figure 1:
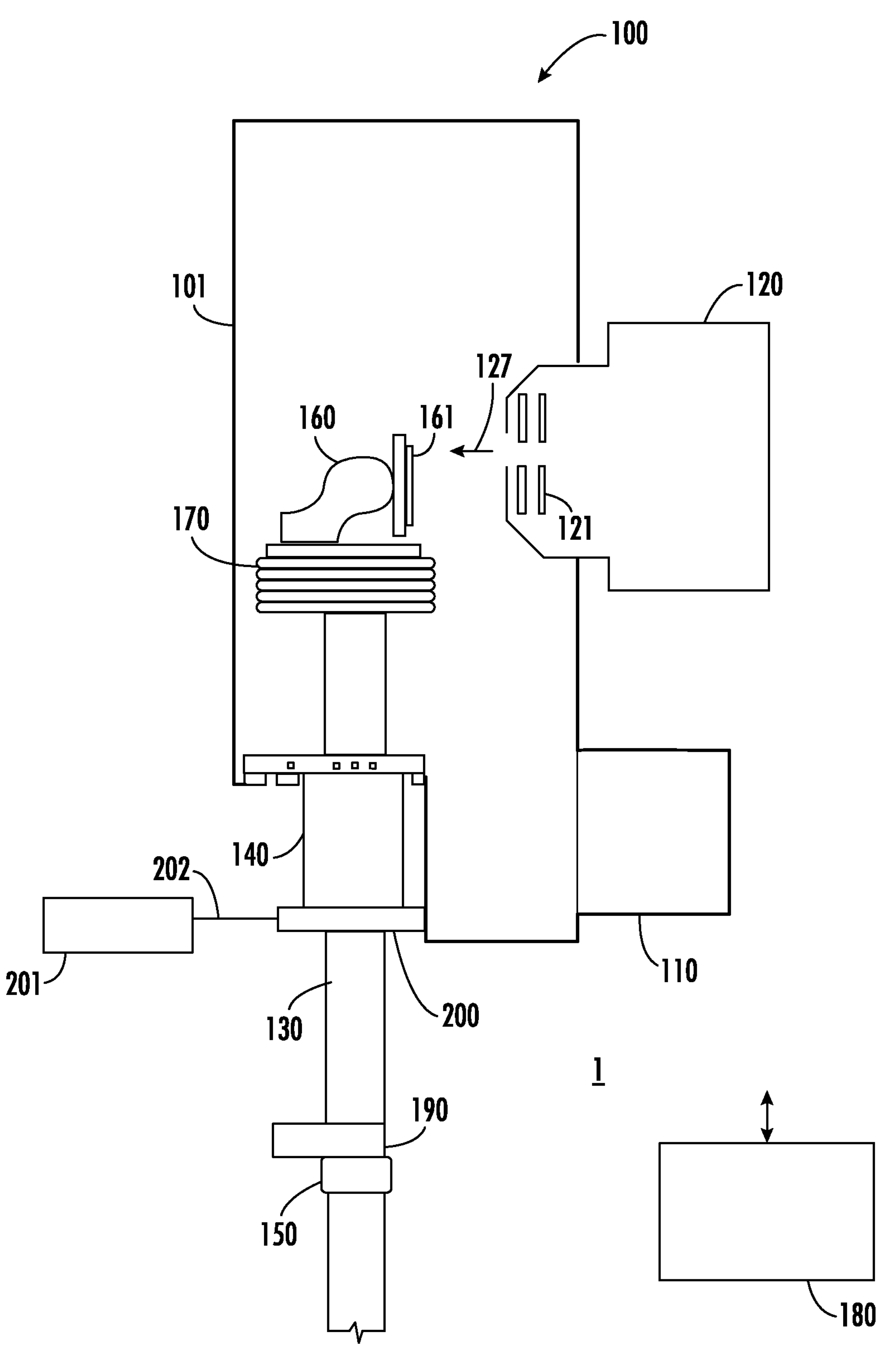
FIG. 1 is a view of the process chamber that utilizes the ring heater according to one embodiment.

FIG. 1 shows a workpiece processing system that addresses this issue. The system may be used for ion implantation, deposition or etching processes. The system includes a process chamber 100, which comprises a plurality of walls 101 that define a sealed volume, which is maintained at near vacuum conditions. One or more vacuum pumps 110 may be in communication with the interior of the process chamber 100 to maintain the near vacuum pressure within the process chamber 100. As noted above, the pressure within the process chamber 100 may be less than 50 millitorr in certain embodiments. In other embodiments, the pressure within the process chamber 100 may be less than 10 millitorr. An ion source 120 may also be in communication with the process chamber 100. One or more extraction electrodes 121 may be disposed within the housing of the ion source 120 to extract the ion beam 127 from the ion source 120. In certain embodiments, a portion of the housing of the ion source 120 is disposed within the process chamber 100. However, in other embodiments, one or more components may be disposed between the ion source 120 and the process chamber 100.

Figure 5:
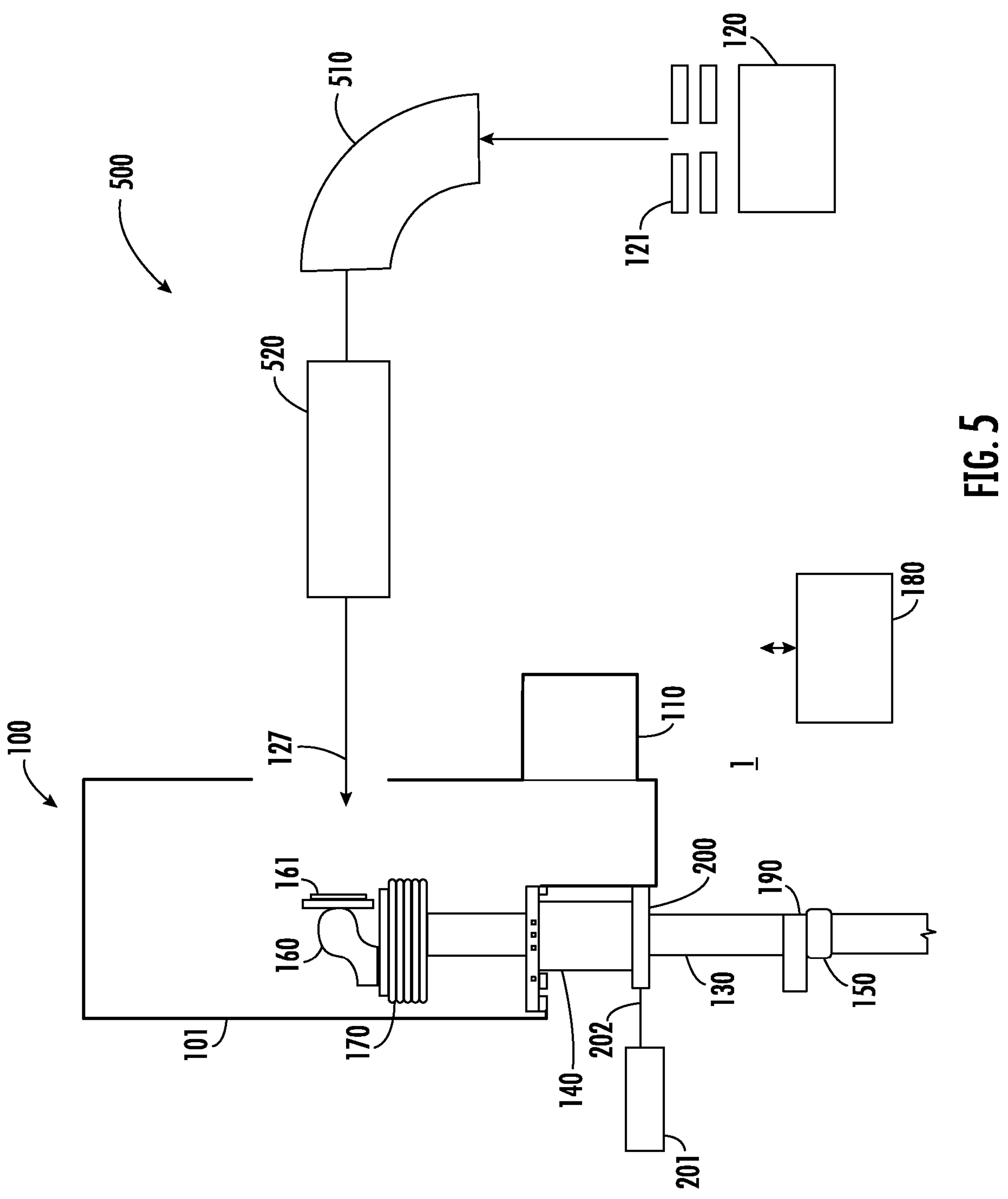
FIG. 5 shows a beam-line ion implantation system that includes a process chamber utilizing the ring heater.

For example, as shown in FIG. 5, a beam-line ion implantation system 500 may have an ion source 120, one or more extraction electrodes 121, a mass analyzer 510, and one or more beam-line components 520, such as one or more acceleration/deceleration stages and a collimator, disposed between the ion source 120 and the process chamber 100. The one or more beam-line components 520 serve to direct the ion beam 127 from the ion source 120 toward the process chamber 100. Further, while FIG. 1 shows the ion source 120 in direct communication with the process chamber 100, and FIG. 5 shows one embodiment of a beam-line ion implantation system 500, other embodiments are possible and the disclosure is not limited to the embodiments shown in the figures. Thus, the process chamber 100 may be used for any process which may include additional or fewer components within and outside the process chamber 100.

As seen in FIG. 1 and FIG. 5, a shaft 130 extends into the process chamber 100. The shaft 130 may be stainless steel. In certain embodiments, the shaft 130 may be nickel coated. In certain embodiments, an air bearing 140 is used to form the barrier between the vacuum conditions within the process chamber 100 and the atmospheric environment 1 external to the process chamber 100. The air bearing 140 also creates a near frictionless interface between the shaft 130 and the wall 101 of the process chamber 100. The shaft 130 may be extended or retracted from the process chamber 100 by means of an actuator 150. A platen 160 is disposed at the end of the shaft 130 that is disposed in the process chamber 100.

A controller 180 may be in communication with the actuator 150 to control the movement of the shaft 130. The controller 180 includes a processing unit and an associated memory device. This memory device contains the instructions, which, when executed by the processing unit, enable the controller 180 to perform the functions described herein. This memory device may be a non-volatile memory, such as a FLASH ROM, an electrically erasable ROM or other suitable devices. In other embodiments, the memory device may be a volatile memory, such as a RAM or DRAM. The processing unit may be a general purpose computer, a special purpose computer, a microcontroller or another type of electrical circuit.

During operation, an ion beam 127 may be extracted from the ion source 120 and directed toward the workpiece 161 that is disposed on the platen 160. The ion beam 127 may not be able to impact the entirety of the workpiece 161 at one time. Therefore, the workpiece 161 may be translated relative to the ion beam 127. This is performed by extending and retracting the shaft 130 from the process chamber 100 using the actuator 150.

As stated above, an air bearing 140 may be utilized to maintain the vacuum seal and to allow near frictionless movement of the shaft 130 relative to the wall 101 of the process chamber 100. Air bearings use a layer of pressurized gas between the shaft 130 and the wall 101 to provide a near frictionless interface.

When the shaft 130 is extended to its maximum position in the process chamber 100, a first fraction of the shaft 130 is disposed within the process chamber 100. Conversely, when the shaft 130 is retracted to its minimum position in the process chamber, a second fraction, smaller than the first fraction, is disposed in the process chamber 100. The retraction of the shaft 130 may be limited by a first end stop 170. Similarly, the extension of the shaft 130 into the process chamber 100 may be limited by a second end stop 190. The end stops define the range of motion of the shaft 130.

It has been found that, in conventional systems, contaminants, such as water vapor, may collect on the portion of the surface of the shaft 130 that is disposed outside the process chamber 100. When the shaft 130 is then extended into the process chamber 100, these contaminants pass through the air bearing 140 and enter the process chamber 100. In some cases, the vacuum pump 110 may draw these contaminants away from the shaft 130. However, the contaminants may affect the workpiece 161 or the other components. In one specific example, the ion beam 127 may comprise halogenated ions, such as fluorine ions. Water vapor may be disposed on the shaft 130. The hydrogen in the water vapor may react with the halogenated ions to form volatile compounds, such as HF or HCl. These acids may cause deleterious effects within the process chamber 100. For example, the acids may damage the shaft 130. The acids may become airborne and damage other components within the process chamber 100, such as the platen 160 or the ion source 120.

Figure 2:
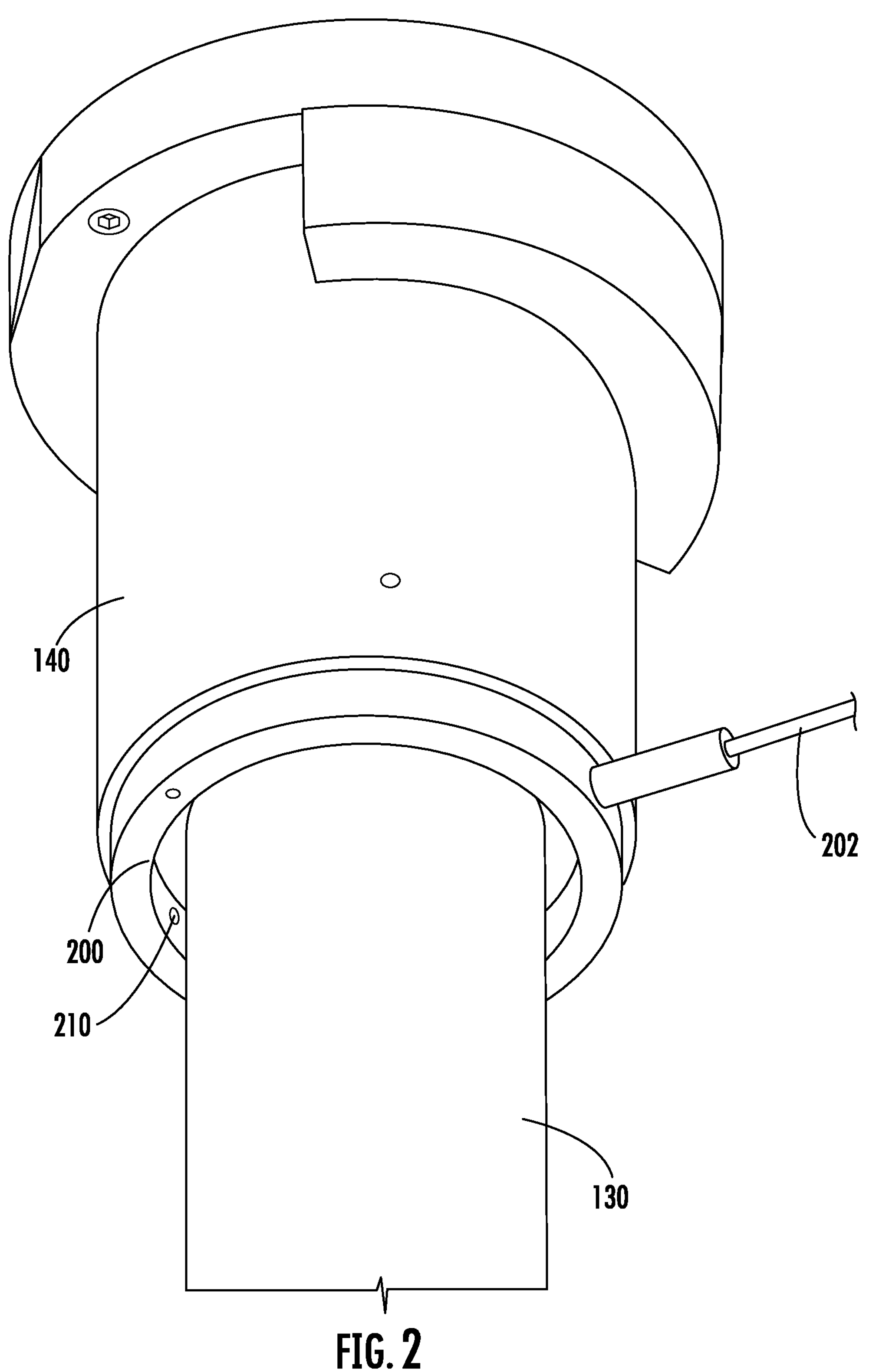
FIG. 2 shows the position of the ring heater relative to the air bearing.

To overcome these issues, a ring heater 200 is installed around the shaft 130. The ring heater 200 is located outside the process chamber 100 in the atmospheric environment 1. As best seen in FIG. 2, in certain embodiments, the ring heater 200 has a hollow round center that surrounds the shaft 130. The ring heater 200 is positioned as close to the air bearing 140 as practical so as to heat any water vapor disposed on the shaft 130 before it enters the air bearing 140. For example, the ring heater 200 may be less than 2 inches from the air bearing 140. In certain embodiments, the ring heater 200 may be less than 1 inch from the air bearing 140.

Figure 3:
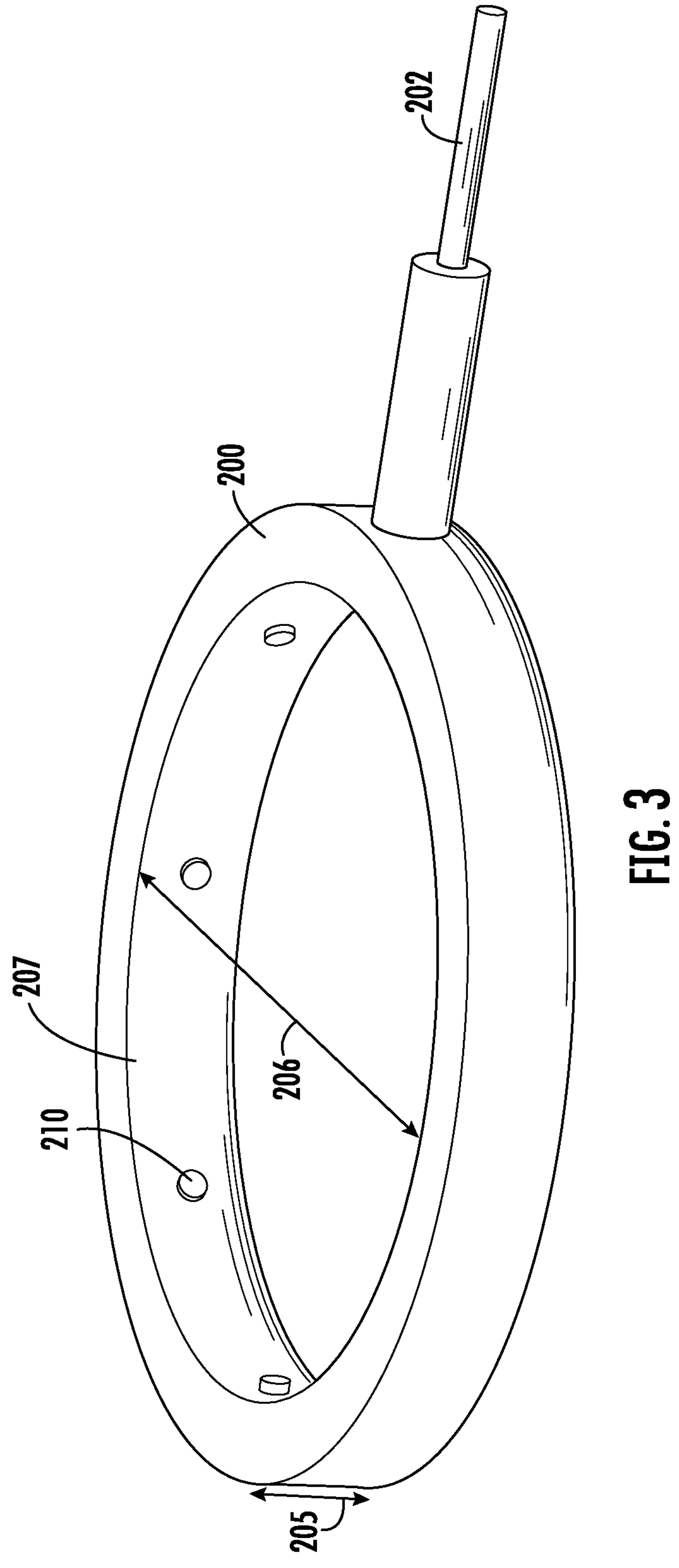
FIG. 3 shows the ring heater according to one embodiment.

FIG. 3 shows an enlarged view of the ring heater 200 according to one embodiment. The ring heater 200 may be constructed of any suitable material, such as aluminum, stainless steel, graphite or other thermally conductive materials. The hollow round center has an inner diameter 206. The inner diameter 206 of the ring heater 200 may be slightly larger than the outer diameter of the shaft 130. In some embodiments, the inner diameter 206 of the ring heater 200 may be less than 1 inch larger than the outer diameter of the shaft 130. Further, the ring heater 200 has a thickness 205, which is perpendicular to the direction of the inner diameter 206 of the ring heater 200, and is defined as the distance between the top surface and the bottom surface. Thus, a region having the thickness 205 located along the inner diameter 206 of the ring heater 200 forms an inner surface 207.

The ring heater 200 includes a plurality of optical energy emitters 210, which are disposed on the ring heater such that energy emitted by the optical energy emitters is directed toward the shaft 130. In some embodiments, the plurality of optical energy emitters may be arranged along the inner surface 207 of the ring heater 200, so as to face the shaft 130. For example, the optical energy emitter 210 may be disposed on the inner surface 207. Alternatively or additionally, the optical energy emitters 210 may be disposed on the top and/or bottom surface of the ring heater 200 and be directed toward the shaft 130. In this disclosure, optical energy is defined as energy radiated in the ultraviolet through infrared bands, having a wavelength between, for example, 10 nm and 30 μm. The number of optical energy emitters 210 is not limited and may be selected to ensure that optical energy is directed at the entire diameter of the shaft 130. Further, the optical energy emitters 210 may be disposed in a single row in the thickness direction, or in multiple rows along the inner surface 207. The number of optical energy emitters 210 and their configuration may be determined based on the power level emitted by each optical energy emitter 210, the diameter of the shaft 130, the thickness of the ring heater 200, the translation speed of the shaft 130, and the amount of water vapor to be removed.

Water has a low absorption coefficient at visible wavelengths between 300 nm and 900 nm. This absorption coefficient may be less than 1.0/m. Additionally, the absorption coefficient increases to more than $10^3$/m at wavelengths above 1.5 μm. At wavelengths above 2.5 μm, the absorption coefficient exceeds $10^4$/m. The range between 2.5 μm and 25 μm represents the mid-infrared band. Thus, in one embodiment, the optical energy emitted by the optical energy emitters 210 is in the mid-infrared range. Furthermore, there is a peak absorption coefficient of more than $10^5$/m at wavelengths between 2.79 μm and 2.94 μm. Thus, in certain embodiments, the optical energy is emitted at a wavelength between 2.79 μm and 2.94 μm, although other wavelengths are also possible.

Figure 4:
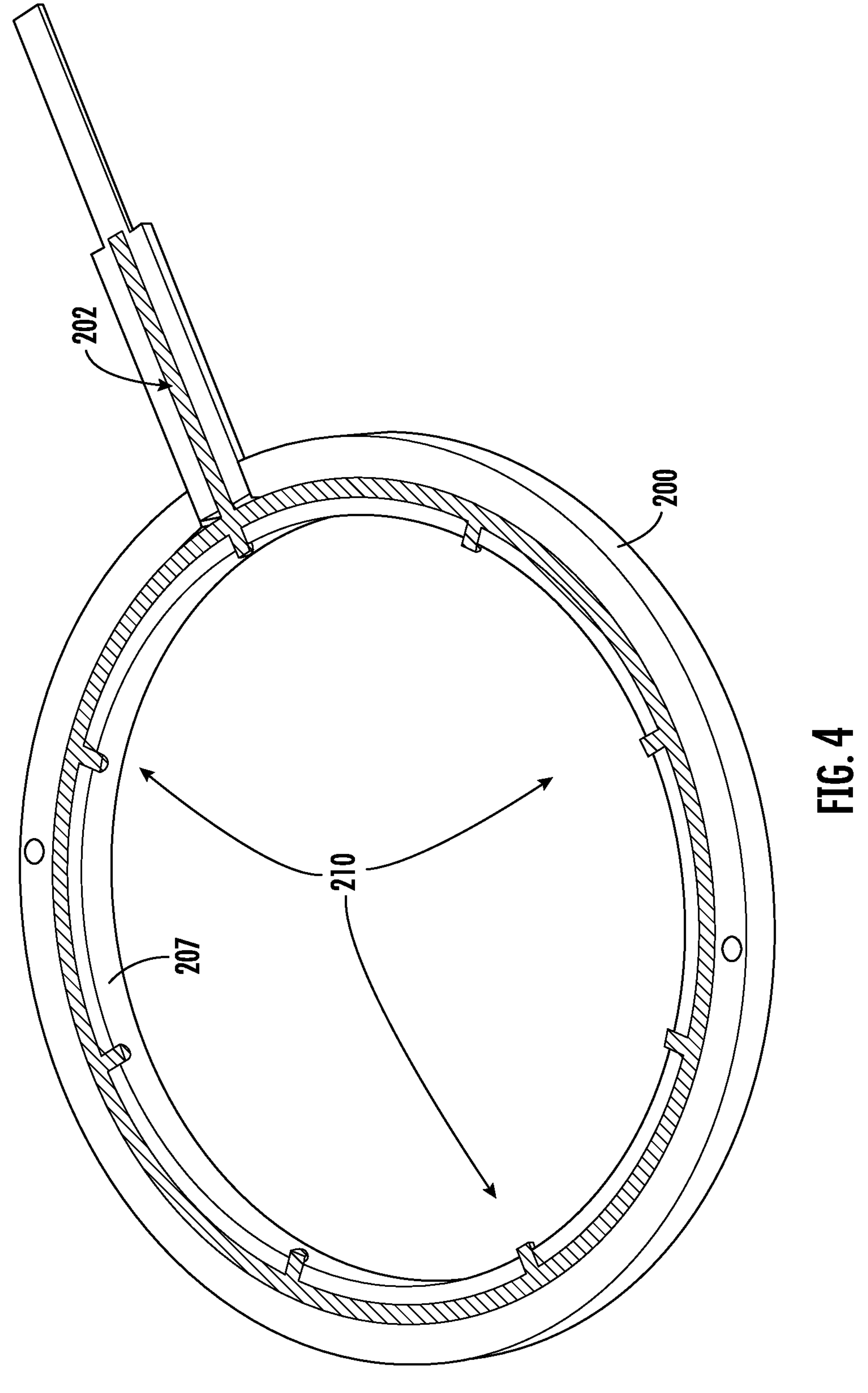
FIG. 4 shows a cross-sectional view of the ring heater according to one embodiment.

In some embodiments, a laser source 201 (see FIG. 1) is used to generate optical energy at the desired wavelength. This laser source 201 may utilize continuous wave (CW) operation. In a first embodiment, the laser source 201 may be a fiber laser, where a fiber is doped with an optical gain medium to create the desired wavelength, which may be between 2.79 μm and 2.94 μm. The optical gain medium may be chromium doped zinc selenide (Cr:ZnSe) or chromium doped zinc sulfide (Cr:ZnS). The energy from the laser source 201 is transmitted through the fiberoptic cables 202 to the ring heater 200. The fiberoptic cables 202 may include a core and an external cladding. In some embodiments, the core may be polycrystalline infrared optical fibers and the cladding may be constructed from a halide material, such as silver halide. In this embodiment, as best seen in the cross-sectional view of FIG. 4, the ring heater 200 includes a plurality of fiberoptic cables 202 that are each directed toward an opening in the inner surface 207 of the ring heater 200. In this embodiment, the optical energy emitters 210 are openings in the inner surface 207 where the fiberoptic cables 202 terminate. The fiberoptic cables 202 may terminate at the inner surface 207 so as to be normal to that surface. In some embodiments, focusing lenses may be disposed at the openings in the inner surface 207 to focus the optical energy. However, in embodiments where the inner surface 207 of the ring heater 200 is relatively close to the shaft 130, focusing lenses may not be utilized.

In some embodiments, the laser source 201 may emit optical energy at a power level of 10 W or greater. In certain embodiments, if the power emitted by one laser source is not sufficient, a plurality of laser sources 201 may be in communication with the ring heater 200.

In another embodiment that utilizes the mid-infrared band, the laser source 201 may be a carbon dioxide ($CO_2$) laser. $CO_2$ lasers are capable of generating in excess of 20 W, and in certain instances more than 100 W, and emit optical energy at wavelengths between 9.3 μm and 10.6 μm. In some embodiments, due to the high power output of the $CO_2$ laser, any wavelength in this range may be used to effectively remove water molecules from the shaft 130. In other embodiments, a particular wavelength in this range may be used. Like the fiber laser, optical energy is transmitted from the $CO_2$ laser through the fiberoptic cables 202 to the ring heater 200.

In another embodiment, the optical energy emitters 210 may be laser light emitting diodes (LEDs), or other similar semiconductor devices that are able to generate energy at the desired wavelength. These laser light emitting diodes may also be referred to as laser LEDs or laser diodes. For example, mid-infrared laser diodes that emit energy in the mid-infrared range, such as at wavelengths between 2.79 μm and 2.94 μm, may also be used. In this embodiment, the fiberoptic cable 202 is not used; rather, the fiberoptic cable is replaced by an electrical conduit that may be used to provide power to the laser diodes. These laser diodes may be mounted on the ring heater 200 such that energy emitted by the laser diodes is directed toward the shaft 130. In some embodiments, the plurality of laser diodes may be arranged along the inner surface 207 of the ring heater 200, so as to face the shaft 130. For example, the laser diodes may be disposed on the inner surface 207. Alternatively or additionally, the laser diodes may be disposed on the top and/or bottom surface of the ring heater 200 and be directed toward the shaft 130.

Additionally, the absorption coefficient of water increases dramatically at wavelengths less than 200 nm, which is in the ultraviolet range. Thus, a laser source 201 or laser diodes that emit energy in this range of wavelengths may also be employed.

In each of these embodiments, the optical energy emitters 210 comprise devices that radiate optical energy at the desired wavelength, which may be in the ultraviolet or mid-infrared ranges. These optical energy emitters may be laser diodes or the ends of a fiberoptic cable.

In certain embodiments, the total amount of power used by the ring heater 200 may be at least 1 W per $cm^2$ of shaft surface area. In other embodiments, this power level may be adjusted based on the amount of water to be removed as well as the translation speed of the shaft 130.

The controller 180 may be used to control the ring heater 200. In certain embodiments, the ring heater 200 is activated when the shaft 130 is being extended into the process chamber 100, so as to heat the water molecules before they enter the air bearing 140. In this way, the thermal energy of the water molecules overcomes the surface binding attractive force and allows the water molecules to leave the surface of the shaft 130. In certain embodiments, the ring heater 200 is not activated when the shaft 130 is being retracted or is stationary. In other embodiments, the controller 180 may activate the ring heater 200 during preventative maintenance processes. Further, in certain embodiments, the translational speed of the shaft 130 may be slowed during the preventative maintenance process to allow more optical energy to be absorbed.

In some embodiments, the shaft 130 is coated with nickel. This provides a lower emissivity surface such that there is minimal heating of the shaft 130 and the optical energy reflects from the shaft 130, creating more photons to energize the water molecules.

Additionally, the above disclosure describes the use of an air bearing 140 to create the seal between the process chamber 100 and the atmospheric environment 1. However, the disclosure is not limited to this embodiment. Rather, any mechanism that allows the shaft 130 to be extended into and retracted from the process chamber 100 may be utilized.

The system and method described herein have many advantages. First, the amount of water that enters a process chamber via the shaft 130 may be greatly reduced. As noted above, in certain embodiments, the ion beam 127 contains fluoride ions, which react vigorously with water molecules to form ozone and hydrofluoric acid. The hydrofluoric acid may etch the shaft 130, the walls 101 of the process chamber 100, or another component within the process chamber 100. Thus, the possibility of this reaction is minimized by reducing the amount of water that enters the process chamber 100 via the shaft 130. Additionally, other mechanisms to reduce contamination have significant drawbacks. Heating the shaft 130 using conventional methods to inhibit the condensation of water is problematic, as the heating of the shaft 130 increases its diameter, creating issues when passing through the air bearing 140. Further, the amount of energy to heat the entirety of shaft 130 exceeds that used to direct the optical energy at a specific portion of the shaft 130. This disclosed approach significantly reduces the amount of water that enters the process chamber, while retaining all of the existing components in the system. Additionally, due to the low emissivity of the shaft 130, there is little heating of the shaft 130 by the ring heater 200 so thermal expansion of the shaft, which can be problematic, is not an issue.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A workpiece processing system, comprising:
a process chamber, maintained at near vacuum conditions;
a shaft extending through a wall of the process chamber, wherein the shaft can be extended into and retracted from the process chamber; and
a ring heater disposed around the shaft and outside the process chamber, wherein the ring heater is configured to emit optical energy toward the shaft.

2. The workpiece processing system of claim 1, wherein the optical energy has a wavelength in a mid-infrared range.

3. The workpiece processing system of claim 1, wherein the optical energy has a wavelength in an ultraviolet range.

4. The workpiece processing system of claim 1, wherein a plurality of optical energy emitters are disposed on the ring heater such that the optical energy emitted by the plurality of optical energy emitters is directed toward the shaft.

5. The workpiece processing system of claim 4, wherein the plurality of optical energy emitters comprise laser light emitting diodes (LEDs).

6. The workpiece processing system of claim 4, wherein the ring heater comprises an inner surface directed toward the shaft and wherein the workpiece processing system further comprises a laser source in communication with fiberoptic cables, wherein the fiberoptic cables terminate along the inner surface, and wherein the plurality of optical energy emitters comprise ends of the fiberoptic cables.

7. The workpiece processing system of claim 6, wherein the laser source comprises a fiber laser emitting optical energy at a wavelength between 2.79 μm and 2.94 μm.

8. The workpiece processing system of claim 6, wherein the laser source comprises a $CO_2$ laser emitting optical energy at a wavelength between 9.3 μm and 10.6 μm.

9. The workpiece processing system of claim 1, further comprising an ion source in communication with the process chamber.

10. The workpiece processing system of claim 1, further comprising an air bearing through which the shaft extends into the process chamber, wherein the ring heater is disposed proximate to the air bearing.

11. A beam-line ion implantation system, comprising:
an ion source to generate an ion beam;
a mass analyzer;
a process chamber, maintained at near vacuum conditions;
one or more beam-line components to direct the ion beam toward a process chamber;
a shaft extending through a wall of the process chamber, wherein the shaft can be extended into and retracted from the process chamber; and
a ring heater disposed around the shaft and outside the process chamber, wherein the ring heater is configured to emit optical energy toward the shaft.

12. The beam-line ion implantation system of claim 11, further comprising an air bearing through which the shaft extends into the process chamber, wherein the ring heater is disposed proximate to the air bearing.

13. The beam-line ion implantation system of claim 11, wherein the optical energy has a wavelength in a mid-infrared range.

14. The beam-line ion implantation system of claim 11, wherein the optical energy has a wavelength in an ultraviolet range.

15. The beam-line ion implantation system of claim 11, wherein a plurality of optical energy emitters are disposed on the ring heater such that the optical energy emitted by the plurality of optical energy emitters is directed toward the shaft.

16. The beam-line ion implantation system of claim 15, wherein the plurality of optical energy emitters comprise laser light emitting diodes (LEDs).

17. The beam-line ion implantation system of claim 15, wherein the ring heater comprises an inner surface directed toward the shaft and wherein the beam-line ion implantation system further comprises a laser source in communication with fiberoptic cables, wherein the fiberoptic cables terminate along the inner surface, and wherein the plurality of optical energy emitters comprise ends of the fiberoptic cables.

18. The beam-line ion implantation system of claim 17, wherein the laser source comprises a fiber laser emitting optical energy at a wavelength between 2.79 μm and 2.94 μm.

19. The beam-line ion implantation system of claim 17, wherein the laser source comprises a $CO_2$ laser emitting optical energy at a wavelength between 9.3 μm and 10.6 μm.

* * * * *